(12) United States Patent
Rovini et al.

(10) Patent No.: US 8,181,083 B2
(45) Date of Patent: May 15, 2012

(54) METHODS AND ARCHITECTURES FOR LAYERED DECODING OF LDPC CODES WITH MINIMUM LATENCY

(75) Inventors: Massimo Rovini, Pisa (IT); Francesco Rossi, Montecatini Terme (IT); Luca Fanucci, Montecatini Terme (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1287 days.

(21) Appl. No.: 11/897,021

(22) Filed: Aug. 27, 2007

(65) Prior Publication Data

US 2009/0063931 A1    Mar. 5, 2009

(51) Int. Cl.
*G06F 11/10*    (2006.01)
(52) U.S. Cl. ...................................... 714/758
(58) Field of Classification Search .............. 714/758, 714/801
See application file for complete search history.

(56) References Cited

U.S. PATENT DOCUMENTS

| | | | |
|---|---|---|---|
| 7,127,659 B2 * | 10/2006 | Richardson et al. ........... | 714/758 |
| 7,139,959 B2 | 11/2006 | Hocevar | |
| 7,181,676 B2 | 2/2007 | Hocevar | |
| 7,886,208 B2 * | 2/2011 | Moon et al. .................... | 714/752 |
| 2005/0138519 A1 | 6/2005 | Boutillon et al. | |

FOREIGN PATENT DOCUMENTS

| | | |
|---|---|---|
| EP | 1622276 | 2/2006 |
| WO | 2006020205 | 2/2006 |

OTHER PUBLICATIONS

IEEE P802.11n/D1.06 Draft Amendment to Standard for Information Technology—Telecommunications and information exchange between systems—Local and metropolitan area networks-Specific requirements-Part 11: Wireless LAN Medium Access Control (MAC) and Physical Layer specifications: Enhancements for Higher Throughput. IEEE P802.11n/D1.06, Nov. 2006.
IEEE P802.16e/D12. Part 16: Air Interface for Fixed and Mobile Broadband Wireless Access Systems. Amendment for Physical and Medium Access Control Layers for Combined Fixed and Mobile Operation in Licensed Bands. IEEE P802.16e/D12 Draft, Oct. 2005.
European Telecommunications Standards Institute (ETSI). Digital Video Broadcasting (DVB); Second generation framing structure, channel coding and modulation systems for Broadcasting, Interactive Services, News Gathering and other broadband satellite applications; ETSI EN 302 307 V1.1.2. (Jun. 2006).
Mohammad M. Mansour and Naresh R. Shanbhag, "High-Throughput LDPC Decoders", IEEE Trans. VLSI Syst., 11(6):976-996, Dec. 2003.
Dale E. Hocevar, "A Reduced Complexity Decoder Architecture via Layered Decoding of LDPC Codes", IEEE Workshop on Signal Processing Systems, SISP 2004, pp. 107-112, 2004.
Massimo Rovini, "Fast-Convergence Architectures & Approximated Algorithms for the Decoding of LDPC Codes" Presentation from the Department of electronic, Informatics and Telecommunications Engineering, Pisa University (Italy), International Workshop on VLSI Architectures for LDPC Decoders, Oct. 6, 2006, pp. 39.

* cited by examiner

*Primary Examiner* — James C Kerveros
(74) *Attorney, Agent, or Firm* — Graybeal Jackson LLP (57) ABSTRACT

An embodiment of a decoder for decoding a Low-Density Parity-Check encoded input data includes a serial processing unit operating in clock cycles to perform serial update of the layers in the code. Operations of the serial processing unit to produce output data for a current layer are pipelined with acquisition of input data for a next layer, whereby the current layer and the next layer may attempt to use soft output information common to both layers. The serial processing unit is configured for delaying acquisition of input data for the next layer over a number of idle clock cycles. Latency due to the idle clock cycles is minimized by selectively modifying the sequence of layers through the decoding process and the sequence of messages processed by a certain layer.

15 Claims, 6 Drawing Sheets

METHODS AND ARCHITECTURES FOR LAYERED DECODING OF LDPC CODES WITH MINIMUM LATENCY

TECHNICAL FIELD

An embodiment of the disclosure relates to coding techniques such as Low-Density Parity-Check (LDPC) coding techniques.

BACKGROUND

Publications and documents referred to throughout this description will be indicated simply by a reference numeral between square brackets (e.g. [X]). A full list of those publications and documents, with the respective reference numerals, is reproduced at the end of this description under the heading "List Of References".

Modern communication systems often require channel codes providing high reliability and decoding schemes suitable to support high data rates. Low-Density Parity-Check (LDPC) codes are among the best candidates to meet these requirements, because they offer near-Shannon limit performance along with an iterative decoding algorithm that allows a high degree of parallelism of the processing, thus favoring the design of high throughput architectures of the related decoder.

However, routing congestion and memory collision might limit a practical exploitation of the inherent parallelism of the decoding algorithm. In order to solve this problem, upcoming standards featuring LDPC codes such as IEEE 802.11n (WiFi) [1], IEEE802.16e (WiMax) [2] and DVB-S2 [3], adopt joint code-decoder design techniques [4]. According to these approaches, the codes are designed with a block structure (having blocks of size P) that naturally fits with the vectorization of the decoder architecture, thus guaranteeing a collision-free parallelism of P.

Joint code-decoder design techniques and the possibility of vectorizing the decoder architecture permit a reduction in the iteration latency, because P processing units work in parallel. Consequently, higher throughputs can be achieved with decoder architectures using more than P processing units in parallel, but, because of the memory collision problem, the complexity overhead (or even the latency overhead brought in by those processing that cannot be done in parallel) can be significant.

Another technique to reduce decoding latency is to consider schedules capable of increasing the convergence speed of the algorithm. In this way, fewer iterations are needed to reach a reference communication reliability, thus increasing the achieved throughput.

Specifically, in [6], a decoder architecture is disclosed which performs a layered decoding of LDPC codes. Changing the sequence of the block-rows is proposed in order to improve error correction capability and convergence speed of the decoder. Presumably, the optimization of the sequence of layers is assessed through off-line computer simulations.

Document [7] discloses an architecture for a layered decoder and considers the problem of using the same Soft-Output estimates by more than one processing unit; to this extent, reordering of the layers in the codes is proposed: specifically, the number of Soft-Output (SO) items in common between consecutive layers is minimized. An approximated method is disclosed for this purpose, which is able to use two independent metrics for the SO in common to consecutive layers, based on redundant memory requirements. However, no optimization algorithm (i.e. by means of a cost function) is proposed to reorder the sequence of layers.

Also document [8] discloses the possibility of inter-layer permutation. Additionally, the possibility of intra-layer reordering is also mentioned in order to improve performance in terms of error correction capability and convergence speed. Emphasis is placed on an approximated architecture for layered decoding of LDPC codes, which is based on the incremental updates on the Soft-Output items processed in parallel by more than one processing unit. Specifically, the number of occurrences of this event (multiple update of a same metric) is minimized in order not to degrade the decoding performance. This is achieved by acting on the number and the way in which the rows of the parity-check matrix are grouped together in a vectorized architecture. Particularly, in grouping rows, care is devoted to minimizing the occurrences of Soft-Output in common to more than one row in the layer. However, multiple updates of a same metric (SO) can result in conflicts during memory access and no strategy is described to optimize the system. The number of conflicts is simply derived (counted) from off-line computer simulation.

Finally, document [9] discloses an architecture for a layered decoder and modifications are introduced in the basic formulation to support increased flexibility in terms of size of the data vector to be processed in parallel. The possibility of changing the order of the output data computed by the serial check-node processor is considered. However, no attempt is made to optimize decoder performance. Specifically, updated messages relating to an earlier layer are output according to the same column-order of the messages currently acquired (and belonging to the next layer to be processed). This approach is based on the presence of storage memory on board of the serial processor itself.

SUMMARY

An embodiment of the disclosure overcomes the intrinsic drawbacks of the LDPC techniques considered in the foregoing.

An embodiment of the arrangement described herein provides a method of efficiently implementing Horizontal Layered Schedule (HLS) decoding of LDPC codes. Efficiency is achieved by means of the minimization of the number of idle cycles introduced among two consecutive processing events for a correct implementation of the decoding algorithm.

In an embodiment, a serial implementation of the decoder architecture is provided, which is constituted by L Serial Processing Units (SPU), performing the serial update of the layers in the code. Serial update means that the processed messages are acquired and stored back in a central memory serially.

The validity of various embodiments considered is independent of the architectural parallelism chosen for the decoder (L>=1) and the resulting efficiency is higher in the implementation of a vectorized (HLS) decoding architecture (using L>1 Serial Processing Units or SPUs in parallel) of structured LDPC codes.

An embodiment of the disclosure relates to an optimization of the sequence of 'layers' used to decode the received codeword. Generally, an optimal order is different from the original native succession of layers in the parity-check matrix. An optimal order of the layers minimizes a cost function defined as the overall number of idle cycles to be added to a decoder iteration to properly perform HLS decoding. The cost function used to optimize the sequence of layers can be defined by applying different strategies, involving the way messages are updated (acquired and produced) by the SPU.

In an embodiment of the disclosure, any constraint on the organization of the input and the output streams of the SPU are removed. This is also referred to as Unconstrained Output Processor (UOP) ordering.

In certain embodiments, sub-optimal performance is achieved by imposing the same organization of the input and the output streams of the SPU. This is also referred to as Equal Output Processor (EOP) ordering.

In certain embodiments, sub-optimal performance is achieved by forcing the output stream of the SPU to have the reversed order of the input stream. This is also referred to as Reversed Output Processor (ROP) ordering.

In an embodiment, system optimization is performed in a two-step procedure:

first, the optimum sequence of layers minimizing the overall latency of the decoding processing is determined through brute-force by means of computer simulation;

then, the messages processed by the SPU are numbered according to the same strategy used for the previous optimization in order to determine the actual sequence of message data to be acquired and delivered by any layer in the code.

In an embodiment, two signals are used to synchronize the operations of the SPU. These signals provide information on the first (start signal) and the last (stop signal) message belonging to a given layer.

In an embodiment, idle clock cycles can be introduced by delaying the start of a new layer with respect to the end of the current one. This occurrence can be detected by the SPU and exploited to suspend the acquisition of the current layer.

In an embodiment, the start and stop signals are produced by using the information derived from optimization, which is stored in dedicated memories (such as ROMs or RAMs), e.g.:

an Idle memory containing the number of idle cycles to be inserted after every layer;

a Parity Read memory containing information about the input stream of messages to the SPU (order of data acquisition);

a Parity Write memory containing information about the output stream of messages to the SPU (order of data computation and storing);

a Degree memory containing information about the number of messages updated by every layer in the code.

In an embodiment, the SPU makes use of a local buffer for storing the variable-to-check messages, which can be implemented e.g. with a distributed memory based on arrays of registers or a concentrated memory based on a bank of RAM memory.

In an embodiment of the UOP strategy, the local buffer is implemented with a bank of RAM memory. In an embodiment of the EOP and ROP strategies, the local buffer is implemented either with registers or with a RAM memory bank.

BRIEF DESCRIPTION OF THE DRAWINGS

Various embodiments of the disclosure will now be described, by way of example only, with reference to the annexed figures of drawing.

DETAILED DESCRIPTION

By way of introduction to the detailed description of certain embodiments of the disclosure, certain basic principles of LDPC techniques will now be briefly recalled.

LDPC Fundamentals

Low-Density Parity-Check (LDPC) codes are linear block codes characterized by a sparse binary matrix H, called the parity-check matrix, whose kernel is the set of the valid codewords. The code can also be described by means of a bipartite graph, known as a Tanner graph (see FIG. 1). This graph is made up of two entities called variable nodes (VN) and check nodes (CN), which are coupled to each other through a set of edges. Specifically, an edge links the check node i to the variable node j if the element $H_{i,j}$ of the parity-check matrix is non-null. The VN (CN) degree denoted in the following as $d_v$ ($d_c$) is the number of edges coupled to that particular VN (CN).

Figure 1:
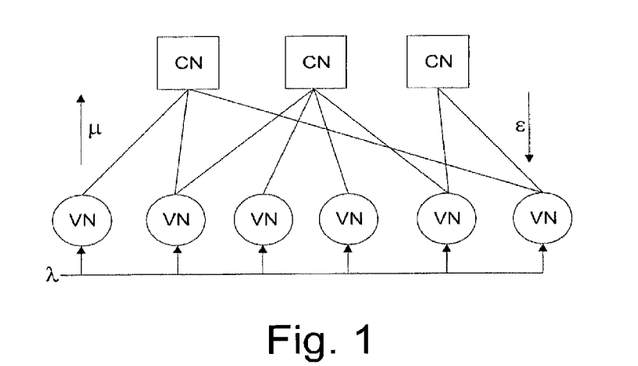
FIG. 1 shows a Tanner graph of a generic LDPC code.

LDPC decoding is achieved through an iterative exchange of probabilistic messages between the VNs and the CNs along the edges of the Tanner graph. The variable-to-check (v2c) messages related to the VN n at the q-th iteration, $\mu_{m,n}^{(q)}$, are updated along with a refinement of the soft A-Posteriori Probability (APP) of the transmitted bit n, $y_n^{(q)}$, also referred to as soft output (SO) in the following, according to:

$$\begin{cases} y_n^{(q)} = \lambda_n + \sum_{i \in M_n} \varepsilon_{i,n}^{(q)} \\ \mu_{m,n}^{(q)} = \lambda_n + \sum_{i \in \{M_n \setminus m\}} \varepsilon_{i,n}^{(q)} = y_n^{(q)} - \varepsilon_{m,n}^{(q)} \end{cases} \quad (1)$$

In equation (1) $\epsilon_{m,n}^{(q)}$ are the check-to-variable messages (c2v) of the neighbouring CNs, whose indexes are identified by the set $M_n$, and $$\lambda_n = \log \frac{Pr\{x_n = 1\}}{Pr\{x_n = 0\}}$$

is the channel intrinsic Log-Likelihood Ratio (LLR) of the n-th received bit $x_n$.

The update of the check-to-variable messages $\epsilon_{m,n}^{(q)}$ is performed separately on signs and magnitudes according to:

$$\begin{cases} -\operatorname{sgn}(\varepsilon_{m,n}^{(q+1)}) = \prod_{j \in \{N_m \setminus n\}} -\operatorname{sgn}(\mu_{m,j}^{(q)}) \\ |\varepsilon_{m,n}^{(q+1)}| = \Phi^{-1}\left\{\sum_{j \in \{N_m \setminus n\}} \Phi(|\mu_{m,j}^{(q)}|)\right\} \end{cases} \quad (2)$$

where $N_m$ is the set of VNs coupled to the CN m, and $$\Phi(x) = \Phi^{-1}(x) = -\log\left(\tanh\left(\frac{x}{2}\right)\right)$$

is the transformation function used for magnitudes.

The VN and CN updates of equations (1) and (2) are performed iteratively until a maximum number of iterations is reached or an early stopping criterion is met.

Decoding Schedules

The classical schedule for LDPC decoding (i.e. the order according to which the v2c and c2v messages are updated) is called "flooding" and the generic iteration is partitioned in two separated phases, performed in sequence: the VN and CN updates. Before starting with a new iteration, the soft estimate for each bit in the codeword is updated. A flooding iteration can be described as follows:

| | Flooding Schedule (FS) |
|---|---|
| 1 | % Initialization % |
| 2 | $q = 0$, $\epsilon_{m,n}^{(0)} = 0$, $\forall n \in \{0, N-1\}$, $\forall m \in M_n$ |
| 3 | repeat |
| 4 | % Variable Node Update % |
| 5 | for all indices of $v_n$, $n \in \{0, N-1\}$ do |
| 6 | % Soft Output Computation % |
| 7 | $y_n^{(q)} = \lambda_n + \sum_{i \in M_n} \varepsilon_{i,n}^{(q)}$ |
| 8 | for all indices of CN $c_i$ connected to variable node $v_n$, $i \in M_n$, do |
| 9 | % Variable-to-check message computation % |
| 10 | $y_n^{(q)} - \epsilon_{m,n}^{(q)}$ |
| 11 | end for |
| 12 | end for |
| 13 | % Check Node Update % |
| 14 | for all indices of parity-check node $c_m$, $m \in \{0, M-1\}$ do |
| 15 | for all indices of variable node $v_j$ involved in the parity-check $c_m$, $j \in N_m$, do |
| 16 | % Check-to-variable sign computation % |
| 17 | $-sgn(\varepsilon_{m,n}^{(q+1)}) = \prod_{j \in \{N_m \setminus n\}} -\operatorname{sgn}(\mu_{m,j}^{(q)})$ |
| 18 | % Check-to-variable magnitude computation % |
| 19 | $|\varepsilon_{m,n}^{(q+1)}| = \Phi^{-1}\left\{\sum_{j \in \{N_m \setminus n\}} \Phi(|\mu_{m,j}^{(q)}|)\right\}$ |
| 20 | end for |
| 21 | end for |
| 22 | $q = q + 1$ |
| 23 | until $q = q_{max}$ or convergence to a codeword. |
| 24 | The decoded bits are hard estimated through the sign of $y_n^{(q)}$. |

The convergence speed can be increased if an alternative schedule, known as layered schedule, is considered (see [4] and [5]). A layer is defined as any set of $L \geq 1$ rows or columns of the parity-check matrix H. For this reason, the names Horizontal Shuffle Schedule (HSS) and Vertical Shuffle Schedule (VSS) are also used to denote the two situations, respectively.

The key principle of the layered schedule is to decode the received codeword on a layer-by-layer basis. After the full decoding (CN plus VN phase) of a layer, intermediate and more updated estimates of the SO are available for use for the next layers. As a result, the decoder convergence speed is almost doubled.

Horizontal layers coincide with a group of L CNs and the related HSS is preferred for implementation, because it is based on the spreading of the VN operations over consecutive layers. Conversely, vertical layers would spread the CN update on many layers, which is more critical to implement.

An efficient hardware implementation of the HSS decoding algorithm is summarized in the following Horizontal Layered Schedule (HLS) decoding algorithm:

| | Horizontal Layered Schedule (HLS) |
|---|---|
| 1 | % Initialization % |
| 2 | $q = 0$, $\epsilon_{m,n}^{(0)} = 0$, $\forall n \in \{0, N-1\}$, $\forall m \in M_n$, $y_n = \lambda_n$, $\forall n \in \{0, N-1\}$ |
| 3 | repeat |
| 4 | % Check Node Update % |
| 5 | for all indices of CN $c_m$, $m \in \{0, M-1\}$ do |
| 6 | for all indices of variable node $v_j$ involved in the parity-check $c_m$, $j \in N_m$, do |
| 7 | % Variable-to-check message computation % |
| 8 | $\mu_{m,n}^{(q)} = y_n - \epsilon_{m,n}^{(q)}$ |
| 9 | end of |
| 10 | for all indices of variable node $v_j$ involved in the parity-check $c_m$, $j \in N_m$, do |
| 11 | % Check-to-variable sign computation % |
| 12 | $-sgn(\varepsilon_{m,n}^{(q+1)}) = \prod_{j \in \{N_m \setminus n\}} -\operatorname{sgn}(\mu_{m,j}^{(q)})$ |
| 13 | % Check-to-variable magnitude computation % |
| 14 | $|\varepsilon_{m,n}^{(q+1)}| = \Phi^{-1}\left\{\sum_{j \in \{N_m \setminus n\}} \Phi(|\mu_{m,j}^{(q)}|)\right\}$ |
| 15 | end of |
| 16 | for all indices of variable node $v_j$ involved in the parity-check $c_m$, $j \in N_m$, do |
| 17 | % Soft Output Computation % |
| 18 | $y_j = y_j + \epsilon_{m,j}^{(q)} - \epsilon_{m,j}^{(q-1)}$ |
| 19 | end for |
| 20 | end for |
| 21 | $q = q + 1$ |
| 22 | until $q = q_{max}$ or convergence to a codeword |
| 23 | The decoded bits are hard estimated through the sign of $y_n^{(q)}$. |

The effect of lines 8 and 18 is to spread the VN update on the considered layer, each coupled VN being updated in line 18. At the same time, the current value of the SO is used to derive the most updated variable-to-check message (line 8).

This continuous refresh of the SOs, passed from layer to layer, explains the increased convergence speed of the algorithm, which is almost the double of the original flooding schedule.

High Throughput Decoder Architecture

The most common technique to boost the throughput is to adopt a partially parallel (or vectorized) decoder architecture, where P processing units work in parallel. When dealing with block-partitioned H matrices, as in IEEE 802.11n, IEEE 802.16e and DVB-S2, the parallelism factor P can be made equal to the size of the building blocks B of the parity matrices that usually are cyclic permutations of the identity matrix.

Figure 2:
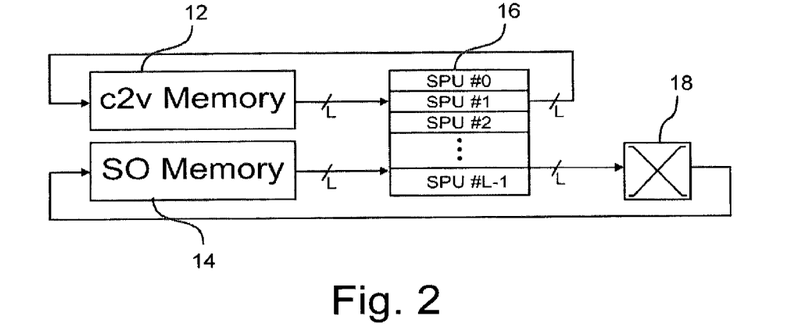
FIG. 2 is a block diagram of a vectorized architecture for a HLS decoder for LDPC codes.

FIG. 2 shows a partially parallel architecture of a decoder implementing a layered schedule. In this case, the layer width L coincides with the expansion factor P and L=P CNs are updated in parallel without conflicts thanks to the LDPC code definition. In fact, there is no attempt to update a certain SO from more than one SPU at a time. The permutation network on the SO data path takes into account the rotations of the building blocks defining the partitioned H matrix.

Each SPU 16 within the vector implements equation (2) (also reported in lines 12 and 14 of the HLS algorithm) along with the input variable-to-check marginalization (see line 8 of the HLS algorithm) and SO update (see line 18 of the HLS algorithm).

Processing in the SPU 16 is performed serially, in that two streams of messages (SO and c2v) are read from a c2v memory 12 and a SO memory 14, respectively. In the SPU 16 those streams are updated and output (output streams of SO and c2v).

The output stream of SO is passed through a shuffle network 18 prior to its storage in the SO memory 14.

A Serial Processing Unit (SPU) 16 may be chosen for low complexity designs, because, with respect to the parallel implementation, it offers an inherent lower complexity, in addition to increased flexibility achieved by easily managing different node degrees with very contained resource overhead. A reference structure for the SPU 16 can be found in FIG. 3.

Figure 3:
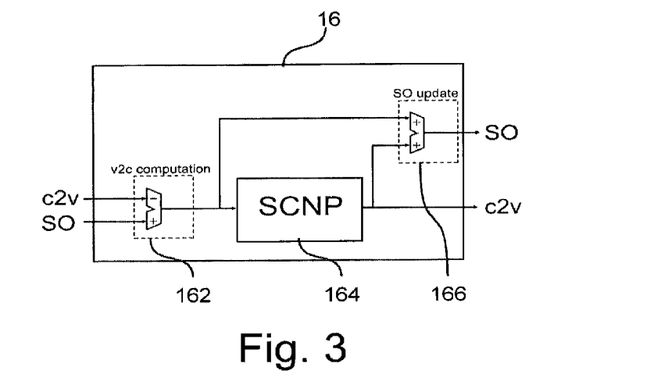
FIG. 3 is block diagram of an architecture for a Serial Processing Unit (SPU).

In an embodiment, the SPU 16 is basically comprised of a Serial CN Processor (SCNP) 164 implementing the CN update according to equation (2). Additional logic is used to perform input v2c message marginalization, such as the computation of the variable-to-check message by block 162, and the refresh of the SOs involved in the current CN update by a block 166, according to line 18 of the HLS algorithm.

In an embodiment, the SPU operates in a pipelined architecture in order to avoid limiting the decoding throughput. Acquisition of the input data (i.e. reading the c2v and SO messages from the related memories 12 and 14) for the next layer k+1 is pipelined with the processing and delivery of the output data (i.e. writing the updated c2v messages and SOs to memories 12 and 14) for the current layer k.

Failure of the HLS Decoding

Whenever two consecutive layers make use of the same SOs, the layered principle may fail due to the pipelined architecture of SPU operation. Indeed, the next layer might attempt to use SOs common to the current layer when these have not been written to the memory yet.

A technique commonly resorted to in order to solve this problem is to delay the new processing with idle cycles until the write phase of the current layer has been completed. However, in this way, the pipeline of the operations is no longer performed.

This is a very conservative, worst-case approach, leading to almost doubling the iteration time. A first rough optimization can be found in determining a proper order of layers that minimize the occurrence of these situations, which arise from the sharing of the SOs among two consecutive layers. This first level of optimization can be used regardless of the structure of the data flow, and in particular it may be the only feasible one when parallel processing units (PPU) are used for the elementary processors.

A different level of optimization can be found considering the typical serial data flow of the SPU. In fact, the SPU offers a further degree of optimization which is the sequence in which messages are acquired from memories and the sequence in which they are output by the processor and written back to memories.

The principle of this optimization is to minimize the number of idle cycles to be inserted for a correct HLS decoding, according to the following assumptions:

i) the SPU should be instructed to read later those SOs which are in common with the previous layer in order to provide more time for their computation;

ii) the SPU should output earlier those SOs which are in common with the next layer in order to make the updated values available for the next layer.

In summary, two levels of optimization can be pursued in the design of an HLS decoder for LDPC codes with the minimum latency of iteration:

the sequence of layers through the decoding process (inter-layer optimization);

the sequence of messages processed by a certain layer (intra-layer optimization).

This can be further split in determining:

a) the sequence (order) of messages acquired by the SPU;

b) the sequence (order) of messages output by the SPU.

Specifically, the optimizations steps a) and b) might be realized independently from each other, or managed jointly.

The arrangement described herein can be applied e.g. in managing and organizing the flow of the processing and the sequence of messages, updated in the HLS decoding of a generic LDPC code. Therefore, the field of possible application might be any communication system or more generally any apparatus where advanced forward error correction based on LDPC is performed. Therefore, this may be exploited by wireless communication systems such as DVB-S2, WiFi, WiMax, UWB, and similar, but also by wired-line systems such as Hard Disk (HD) controllers.

As mentioned above, whenever two consecutive layers share the same SOs, which are then common, idle cycles may be added before starting the acquisition of the next layer. This operation aims at allowing the implementation of the exact HLS decoding algorithm.

Of course, by increasing the number of idle cycles, also the time required to complete an iteration increases, and therefore, throughput decreases. In order to achieve optimal performance, the number of idle cycles is optimized.

Concerning a generic layer k, composed by L CNs with degree $d_k$, let $I_k$ be the number of idle clock cycles inserted between the end of the acquisition of layer k and the start of the acquisition of layer k+1; the following definitions play a significant role in determining the number of idle cycles for the layer k:

$S_k$: the whole set of SOs updated within the current layer k;

$A_k$: the subset of SOs of the layer k in common with layer k−1;

$B_k$: the subset of SOs of the layer k in common with layer k+1 but not contained in $A_k$;

$C_k$: the subset of SOs of the layer k in common with both layers k−1 and k+1 (by definition, $C_k \subseteq A_k$);

$E_k$: the subset of SOs of the layer k in common with layer k−2 and not in $A_k \cup B_k$;

$F_k$: the subset of SOs of the layer k in common with layer k+2 but not already contained in $A_k \cup B_k \cup E_k$;

$G_k$: the subset of SOs of the layer k in common with both layers k−2 and k+2, but not in $A_k \cup B_k \cup E_k$ (by definition, $G_k \subseteq E_k$);

$R_k$: the subset of remaining SOs of layer k, not in common with any of the layers k−2, k−1, k+1 and k+2.

The following variables may be defined:

$$\begin{cases} d_k = |S_k| \\ \alpha_k = |A_k| \\ \beta_k = |B_k| \\ \chi_k = |C_k| \\ \varepsilon_k = |E_k| \\ \phi_k = |F_k| \\ \gamma_k = |G_k| \\ \rho_k = |R_k| \end{cases} \quad (3)$$

The overall latency $L_{SO}$ of the data-path of the SOs plays a role in determining $I_k$. With reference to FIG. 2, this includes the acquisition of input values from the SO memory 14, their update in the SPU 16, the shuffling in the permutation network 18 and the final storage back into the SO memory 14. $L_{SO}$ is measured as the distance, in clock cycles, between the time of acquisition of the last message involved in the update of a generic layer, and the time of writing to memory of the first updated message, which is then ready for a subsequent reading.

As mentioned above, two levels of optimization are viable, namely inter-layer and intra-layer optimization. As far as the intra-layer optimization is concerned, three different aspects may be considered for optimization, which are the sequence of input messages, the sequence of the output messages and the eventual presence of a constraint relationship between the two. This last relationship can be brought in by the internal architecture of the SPU.

A first optimization may leave the input and output sequence of messages fully unconstrained, thus yielding an overall smaller number of idle cycles. This means that the two input and output streams can be optimized independently. This solution might result in a higher complexity of the SPU, or it might not be possible to implement the solution with any generic architecture of the SPU. In the following this strategy is referred to as Unconstrained Output Processor (UOP) ordering.

Another implementation of the SPU constrains the two input and output streams of messages to have the same sequence (order). This policy is usually accompanied by the lowest implementation complexity but the optimization space is strongly constrained and may be considered suboptimal with respect to the first solution. In the following this strategy is referred to as Equal Output Processor (EOP) ordering.

Often, it can occur that the SOs of the current layer (k) that are in common with the previous layer (k−1), are also in common with the following layer (k+1); consequently, a good solution can be found in constraining the output sequence to follow the same order of the input sequence, but reversed. This is another sub-optimal solution, but with certain codes it can provide very good performance, close to the optimum, but with lower implementation complexity. In the following this strategy is referred to Reversed Output Processor (ROP) ordering.

In the following, a detailed description of possible methods used to determine and minimize the number of idle cycles is given for each of the three strategies mentioned above.

Unconstrained Output Processor ordering (UOP)

Optimal performance, i.e. the minimum number of idle cycles, can be expected if no constraints are imposed on (i.e. on the relationship between) the input and output sequence of the SPU. In other words, the output messages can be reordered independently from the input order, and according to any arbitrary law. The optimal approach is then to prepare the output sequence in the most suitable way for the next layer, which, in turn, will acquire its own data in the most suitable way for the previous layer.

Figure 4:
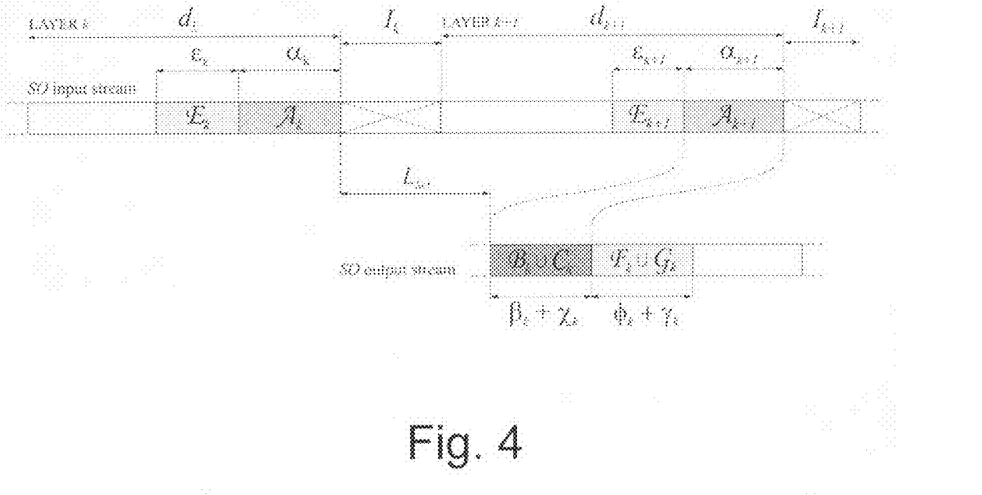
FIG. 4 is representative of an idling model according to a first strategy (UOP) as described herein.

More precisely, this means that the sequence of updated SOs will locate the messages in common with the next layer (i.e. within the set $B_k \cup C_k$) on its first locations. For the same reason, the layer k will acquire the messages common to the previous layer later, i.e. messages in $A_k$ will be input later. This situation is shown in FIG. 4 where the data stream related to the layers k and k+1 is considered. Particularly, the upper line shows the sequence of the input messages entering the SPU and retrieved from the SO memory. The lower line relates to the data stream of updated SO messages, after processing in the SPU and in the shuffling network, and final storage back in SO memory.

The latency $L_{SO}$ between message acquisition and storage in the memory is the overall latency of the data path for SO, and may amount to 5 to 8 clock cycles. Depending on the architecture used to implement the SPU, 2 to 4 clock cycles are required to start output of the updated messages, 1 or 2 cycles are needed to perform the shuffle of the message vector, and finally, 2 clock cycles are used to read from and write into the SO memory.

Typically, the acquired data stream is organized in the following way:
all messages not in $A_k$ and not in $E_k$ are read earlier.
then, messages in $E_k$ follow;
finally, messages in $A_k$ complete the acquisition of layer k;
The output stream may be organized in the following way:
messages in $B_k \cup C_k$ are output earlier;
messages in $F_k \cup G_k$ follow;
then, all remaining messages are output.

During the acquisition phase, messages in $A_k$ are read with the same order the set $B_{k-1} \cup C_{k-1}$ was written to the memory; similarly, messages in $E_k$ are read with the same order the set $F_{k-2} \cup G_{k-2}$ was written to the memory.

If layer k and the following layer (k+1) share some SOs, meaning that $\alpha_{k+1} > 0$, then messages in $B_k \cup C_k$ are completely written to the SO memory before the next layer k+1 attempts to use them. This poses a constraint on the number of idle cycles to be added before starting elaborating the layer k. Comparing the input and output data stream, the following condition may hold for a correct HLS decoding:

$$I'_k + |S_{k+1} \setminus A_{k+1}| \geq L_{SO} \quad (4)$$

where $|\cdot|$ denotes the cardinality of a set, and the operator "\" means subtraction between the elements of two sets. Equation (4) might be transformed to:

$$I'_k + (d_{k+1} - \alpha_{k+1}) \geq L_{SO} \quad (5)$$

The minimum number of idle cycles that does not violate HLS decoding is then:

$$I'_k = L_{SO} - (d_{k+1} - \alpha_{k+1}) \quad (6)$$

Since the result of equation (6) might be negative, $I'_k$ is further constrained to be non-negative. Another element to take into account is that, assuming the absence of idle cycles, the SPU cannot support decreasing degrees among two consecutive layers. The reason is that having decreasing degrees (i.e. $d_{k+1} < d_k$), leads to an overlap in time of the output streams of two layers, and thus to the presence of conflicts when writing to the SO and c2v memories as well as to internal failures in the SPU itself. In order to avoid this situation, idle cycles could be inserted equal to the difference between the current and the next layer degree. However, these additional idle cycles need be inserted only if those already inserted for the sequencing of the HLS decoding are not sufficient.

To summarize, the actual number of idle cycles to insert is given by:

$$I_k = \max\{I'_k, \Delta d_k, 0\} \tag{7}$$

with $\Delta d_k = d_k - d_{k+1}$.

This arrangement also avoids the possible interaction between three consecutive layers. Indeed, the problem is that some of the messages of current layer k could be written when layer k+2 has already started its acquisition operations. However, if the messages output by layer k are structured in such a way that messages in $F_k \cup G_k$ (which are responsible for a possible interactions with layer k+2) immediately follow those in the set $B_k \cup C_k$, then there should be no chance for layer k+2 to acquire not-updated messages from the SO memory. To this extent, the messages in the set $E_{k+2}$ (or more generally of $E_k$) could actually be left unconstrained on the input stream; what really matters now is that the messages in $E_{k+2}$ are acquired respecting exactly the same order used by layer k to output the set $F_k \cup G_k$.

Equal Output Processor (EOP)

A sub-optimal strategy is to deliver the updated SOs with the same order used for their acquisition from memory. This is the simplest and most straightforward type of constraint between the input and the output data streams of the NP.

In this case it may be desirable to i) take the messages in $A_k$ as late as possible and ii) deliver the messages in $B_k$ as soon as possible. Actually, the last requirement is effective only when the set $C_k$ is empty; otherwise, since some messages common to layer k+1 are contained in $A_k$ (by definition $C_k$ is a sub-set of $A_k$) the set $B_k$ could be acquired anytime before Ak.

Figure 5:
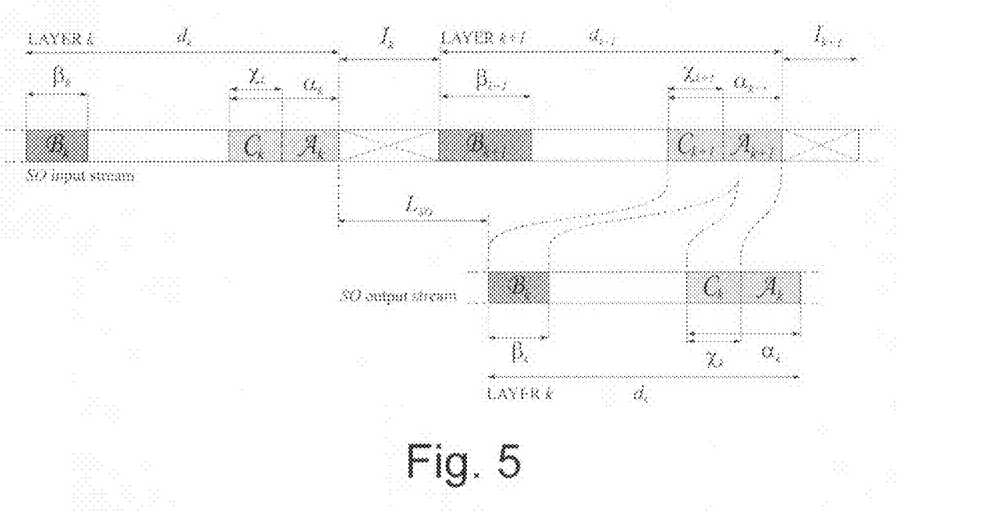
FIG. 5 is representative of an idling model according to a second strategy (EOP) as described herein.

The ordering of the messages within the input stream, being the same of the output stream, is shown in FIG. 5 and is done according to the following rules:

the SOs messages in $B_k$ are acquired first in order to be also delivered first;

then, all SOs not in $B_k$ and not in $A_k$ follow;

finally, the messages in the set $A_k$ are output last.

At acquisition time, messages in $A_k$ are taken with the same order they were output by layer k−1, i.e. as output in $B_{k-1}$ and $C_{k-1}$. For this reason, although it may be desirable to output $C_k$ first within $A_k$, the messages in $C_k$ are not fixed to have any specific position in $A_k$, but they are rather left unconstrained; if this were not the case, messages in $C_k$ would need to meet two independent constraints (the acquisition order imposed by the previous layer and the position within $A_k$), which can be mutually exclusive. Thus, the representation of FIG. 5 is primarily for the sake of a clearer drawing.

Thus, the number of idle cycles ensures that (see also FIG. 5):

$$I'_k + |S_{k+1} \setminus A_{k+1}| \geq L_{SO} + |S_k \setminus (A_k \cup B_k)| \cdot u(|C_k|) \tag{8}$$

with u(x) the unit step function: if $C_k$ is empty, the messages not in $A_k \cup B_k$ are not awaited and not included in the right hand term of (8), since no other element common to layer k+1 follows in $A_k$.

Clearly, expression (8) has been formulated in the best-case condition where the set $C_k$ is thought to be output first within $A_k$, which is also the situation of FIG. 5. In this case, the minimum latency is achieved with $$I'_k = L_{SO} - (d_{k+1} - \alpha_{k+1}) + \{d_k - (\alpha_k + \beta_k)\} \cdot u(\chi_k) \tag{9}$$

This best-case assumption may not always occur, and a worst-case situation where the messages in $C_k$ are output last within $A_k$ may be considered. In such a case, we would have to include the messages in the set $A_k \setminus C_k$ on the right hand term of (8) which would become:

$$I'_k + |S_{k+1} \setminus A_{k+1}| \geq L_{SO} + |S_k \setminus (B_k \cup C_k)| \tag{10}$$

The worst-case approach is intrinsically more conservative and tends to overestimate the number of idle cycles, since it is based on the worst-case assumption about the position of messages in $C_k$ within $A_k$.

On the contrary, the best-case approach is intrinsically more optimistic, and tends to underestimate the number of idle cycles, since the assumption on which is based may not always occur in practice. For this reason, in the case of residual violations of the dependence between layers, additional idle cycles may be added to those given by (8).

The best-case approach generally yields results better than, or at most equal to those achieved with the worst-case approach.

As mentioned above, additional idle cycles could be added to compensate the presence of following layers with decreasing degrees.

Thus the final number of idle cycles is given by:

$$I_k = \max\{I'_k, \Delta d_k, 0\},$$

with $\Delta d_k = d_k - d_{k+1}$.

So far, we only focused on the interaction between two consecutive layers; however, dependence could also be violated between three consecutive layers, if layer k and k+2 share some common SOs, and the latter attempts to use those messages before being really updated. Particularly, this issue may arise if some of the messages in $A_k$ (and then common to layer k and k−1) are also common to layer k+2. This situation is rather unlikely: as matter of fact, EOP results in several idles cycles, and the presence of idle cycles between layer k+1 and k+2 can also play as a guard interval for the possible interaction between layers k and k+2.

Reversed Output Processor (ROP)

As already mentioned in the foregoing, an improved trade-off between latency overhead and complexity can be envisaged in comparison to EOP, when the order of the updated SOs is reversed with respect to the input sequence. Indeed, this solution is suitable for codes where most layers are coupled to a common set of SOs. In this case, the messages that are acquired later by a generic layer k because in common with the previous layer k−1, need also to be output earlier, because it is very likely that these same messages are also in common with the following layer k+1.

a) Simple Model: Dependence Between Two Layers

Figure 6:
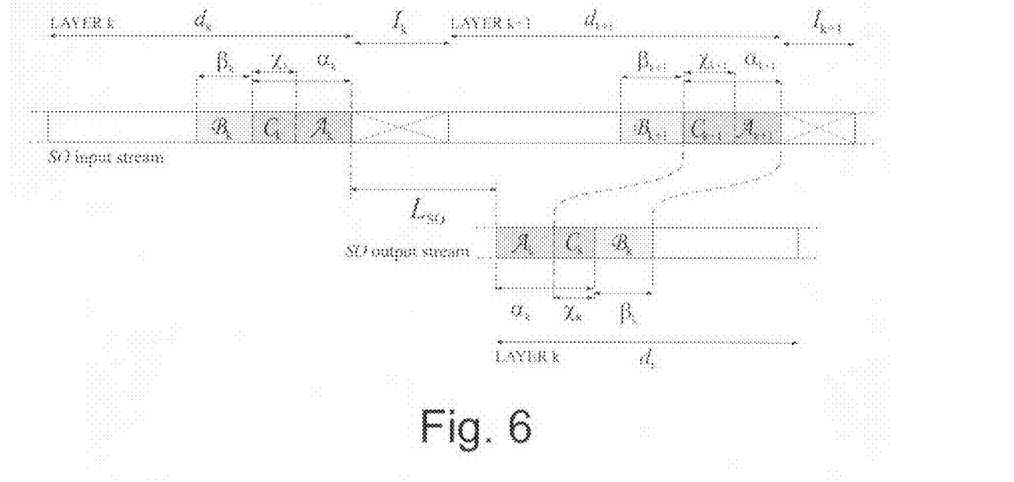
FIG. 6 is representative of an idling model according to a third strategy (ROP) as described herein.

FIG. 6 shows the organization of the input and output streams of SO related to the interaction of two consecutive layers. As far as the acquisition phase is concerned, the messages are read according to the following rules:

SOs not in $A_k \cup B_k$ are acquired first;

then, the SOs in $B_k$ follow;

the SOs in $A_k$ are acquired later in order to provide more time to layer k−1 for their update.

At acquisition time, messages in $A_k$ are acquired with the same order they were updated by layer k−1, i.e., the order used to output the set $C_{k-1} \cup B_{k-1}$.

Due to the reversal of the output sequence, messages in $B_k$ are delivered just after $A_k$, thus favouring the operations of the next layer k+1; the output data stream is arranged as follows:

the (updated) SOs in $A_k$ are output first;

then, the (updated) SOs in $B_k$ follow;

finally, all the SOs not in $A_k \cup B_k$ complete the output stream.

As far as the messages in the set $C_k$ are concerned, similarly to EOP, their position is left unconstrained within $A_k$: otherwise, two independent and exclusive constraints would be imposed in the (sub)set $C_k$, which like the whole $A_k$, is acquired with exactly the same order used by layer k−1 to output $C_{k-1}$ and $B_{k-1}$; this is not the situation of FIG. 6, where $C_k$ is shown to be output first within $A_k$ just for the sake of an easier representation.

A condition that holds for a correct HLS decoding can be expressed by:

$$I'_k + |S_{k+1} \setminus A_{k+1}| \geq L_{SO} + |A_k \setminus C_k| \cdot u(|B_k|) \quad (11)$$

When the set $B_k$ is empty, it may be convenient to output $C_k$ first within $A_k$, and a number of clock cycles equal to $|A_k \setminus C_k|$ appearing on the right hand term of (11) is actually awaited only if $B_k$ is not empty; this explains the presence of the unit step function on the same right hand term of equation (11).

However, as discussed above, the position of messages belonging to $C_k$ is actually unconstrained within $A_k$, and the situation in (11) represents a best-case scenario, based on the assumption that if the set $B_k$ is empty, the set $C_k$ is output first in $A_k$. Similarly to the EOP arrangement, this best-case assumption needs to be verified carefully, and it generally yields better results (fewer idle cycles) than a conservative, worst-case approach in which $C_k$ is thought to be output last in $A_k$, although $B_k$ is empty.

Equation (11) can be transformed into:

$$I'_k + (d_{k+1} - \alpha_{k+1}) \geq L_{SO} + (\alpha_k - \chi_k) \cdot u(\beta_k) \quad (12)$$

The minimum number of idle cycles avoiding a violation of the HLS decoding is then:

$$I'_k = L_{SO} - (d_{k+1} - \alpha_{k+1}) + (\alpha_k - \chi_k) \cdot u(\beta_k) \quad (13)$$

By comparing equation (13) with equation (9) a higher number of idle cycles can be expected with respect to the UOP strategy.

b) Refined Model: Dependence Between Three Layers

Figure 7:
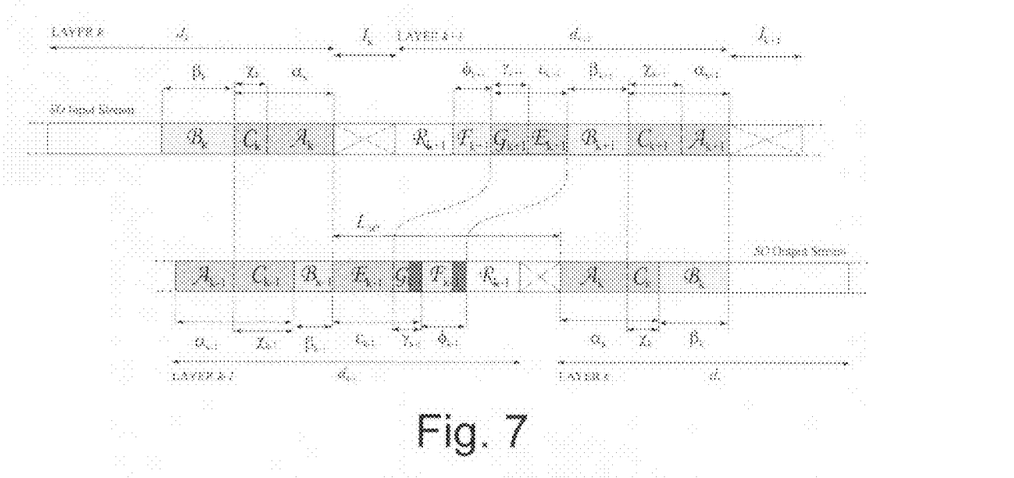
FIG. 7 is representative of a refined idling model according to strategy (ROP) represented in FIG. 6.

Similarly to EOP, the ROP strategy may be influenced by the dependence between three consecutive layers, and because of the reversal of the output stream, the issue now is much heavier. This situation is shown in FIG. 7, where, the messages output by layer k−1 are also shown. Now, the sets $E_k$, $F_k$, and $G_k$ play a similar role to $A_k$, $B_k$, and $C_k$ in the dependence between two consecutive layers; thus, as before, the ROP strategy aims at acquiring the set $E_k$ as late as possible, and to output $F_k$ as soon as possible.

With focus on the current layer k, the updated messages of layer k−1 are also shown along with the possible interaction with the next layer k+1. By definition, the SOs in the set $\{F_{k-1} \cup G_{k-1}\}$ are shared between layers k−1 and k+1. However, the situation is even more complicated, since there is no equivalence of these messages with the whole set $E_{k+1}$; rather, it is:

$$E_{k+1} \subseteq \{F_{k-1} \cup G_{k-1}\} \quad (14)$$

The reason behind equation (14) is that some of the messages in the set $\{F_{k-1} \cup G_{k-1}\}$ may also be already part of $E_{k+1}$. This is highlighted in FIG. 7, where those messages of $F_{k-1}$ and $G_{k-1}$ that are not in $E_{k+1}$, are marked in dark grey.

As an extension of the simple model considering only the interaction between two consecutive layers, the input stream is arranged like this:

SOs in $R_k$ (i.e., not in $A_k$, $B_k$, $E_k$ and $F_k$) are acquired first;
then, the SOs in $F_k$ not in $E_{k+2}$ follow (i.e., SOs in the set $\{F_k \setminus E_{k+2}\}$);
then, the remaining SOs in $F_k$ follow (i.e., SOs in the set $\{F_k \cap E_{k+2}\}$);
then, the SOs in $E_k$ follow;
then, the SOs in $B_k$ follow;
finally, the SOs in $A_k$ conclude the input stream.

Messages in $C_k$ (also contained in $A_k$), may not be constrained to any fixed location within the set $A_k$; however, it is convenient to think them on the first locations of $A_k$ when the set $B_k$ is empty, as discussed for the simple model.

Similarly, messages in $G_k$ (also contained in $E_k$) may not be placed at any fixed location within the set $E_k$; however, it is convenient to think them on the first locations of $E_k$ when the set $F_k$ is empty, similarly to $C_k$ in $A_k$. This is not the situation sketched in FIG. 7, just for the sake of a clearer picture.

Due to the reversed output order, the updated sequence of messages is output according to the order: $A_k$, $B_k$, $E_k$, $\{F_k \cap E_{k+2}\}$, $\{F_k \setminus E_{k+2}\}$, $R_k$.

Messages in $A_k$ are acquired with the same order in which the set $C_{k-1} \cup B_{k-1}$ was written to the SO memory by the layer k−1. This is also the reversed order in which layer k−1 acquired them.

Messages in $E_k$ are acquired with the same order in which the set $G_{k-2} \cup F_{k-2}$ was written to the SO memory by the layer k−2. This is also the reversed order in which layer k−2 acquired them.

In order to avoid a violation across layer k−1 and k+1, generally a higher number of idle cycles could be required before starting layer k+1. Comparing the input and output data paths of FIG. 7, the additional idle cycles can be calculated to:

$$I''_{k+1} = ACQ_{k+1} - WR_{k-1} \quad (15)$$

where $ACQ_{k+1}$ is the margin (in clock cycles) for the acquisition phase of the layer k+1, and $WR_{k-1}$ is the margin (in clock cycles) to complete the storage of messages of layer k−1 in the memory.

These can be expressed as:

$$\begin{cases} ACQ_{k+1} = I'_k + |R_{k+1} \cup F_{k+1}| \\ \qquad\quad = I'_k + d_{k+1} - (\alpha_{k+1} + \beta_{k+1} + \varepsilon_{k+1}) \\ WR_{k-1} = (\varepsilon_{k-1} - \gamma_{k-1} + |G_{k-1} \setminus E_{k-1}|) \cdot u(\phi_{k-1}) \end{cases} \quad (16)$$

Similarly to $C_k$, the writing margin $WR_{k-1}$ is only accounted for if the set $F_{k-1}$ is not empty; note that now the set $F_{k-1}$ is not subject to any constraint, and its messages not in $E_{k+1}$ (i.e., the messages $F_{k-1} \setminus E_{k+1}$) can be conveniently output last in $F_{k-1}$ to save idle cycles.

Conversely, when the set $F_{k-1}$ is empty, $WR_{k-1} = 0$ under the two assumptions that i) the set $G_{k-1}$ is output first within $E_{k-1}$ and, ii) within $G_{k-1}$, the messages not in $E_{k+1}$ are output last. Again, these are two best-case hypotheses.

As opposed to this best-case assumption on the position of $G_{k-1}$ when $F_{k-1}$ is empty, in a worst-case scenario the messages in $G_{k-1}$ would be expected last in $E_{k-1}$ and, moreover, the messages of $G_{k-1}$ not in $E_{k+1}$ would be output first in $G_{k-1}$. In such a worst-case scenario, the writing margin would become $WR_{k-1} = (\varepsilon_{k-1} - \gamma_{k-1} + |G_{k-1} \setminus E_{k+1}|)$, but the best-case approach is highly preferred as it gives performance better than or at most equal to the worst-case scenario.

Term $I'_k$ in (i.e. number of idle cycles required by the interaction between layers k and k+1) can be computed according to equation (13).

Again, the actual number of idle cycles is constrained to be non-negative and greater than or equal to the difference between the CN degree of layer k and k+1, thus $$I_k = \max\{I''_k, \Delta d_k, 0\}$$

System Optimization

As mentioned in the foregoing, two levels of optimization can be used, namely inter-layer and intra-layer optimization. Both are tailored to select a proper strategy for organizing the messages processed by the SPU, which can be performed according to one of the strategy designated as UOP, EOP, or ROP.

The inter-layer optimization aims at defining the optimal sequence of layers minimizing the iteration time of the decoder, while the intra-layer optimization determines the actual composition of the input and output streams of messages of the SPU, which is compatible with the current sequence of layers.

Inter-Layer Optimization

Given a strategy for the organization of the messages on the input and output stream of the SPU, the following cost function can be calculated:

$$C = \sum_{k=0}^{\Lambda-1} I_k \quad (17)$$

Equation (17) can be used to compare different sequences of layers forming a decoding iteration. The optimum sequence yields the minimum number of idle cycles, i.e. it minimizes C. In this case the smallest number of idle cycles is added to complete an iteration, which means the iteration time and the decoding latency are optimized for the strategy used to arrange the I/O data streams for the SPU. Dually, the decoding throughput is maximized.

Considering the set of all the possible permutations p of the sequence of $\Lambda$ layers defined in the decoding process, the permutation $\hat{p}$ minimizing the number of extra idle cycles can be expressed as:

$$\hat{p} = \arg\min_{p \in P}\{C(p)\} \quad (18)$$

In equation (18) the cost function C(p) is evaluated for the current permutation p of the layers. The search of $\hat{p}$ can be carried out by means of brute force with a PC passing through all the $\Lambda$! possible permutations of the sequence of layers, in order to determine the minimum cost $\hat{C}$. Those skilled in the art will appreciate, that other search algorithms can be used without departing from the scope of the disclosure.

Together with the optimal permutation $\hat{p}$, the search algorithm computes also the related number of idle cycles $I_k$ to be inserted in the code after each layer k (k=0, 1, ..., $\Lambda$-1) for the implementation of the layered decoder.

As a result of the layers permutation, a permuted parity-check matrix $\hat{H}$ can be defined, by simply scrambling the layers of the original H parity-check matrix according to the law specified by $\hat{p}$.

Intra-Layer Optimization

Once the inter-layer optimization has been performed, the sequence of layers $\hat{p}$ minimizing the iteration latency is known. Then, messages input and output by the SPU is numbered in a way compliant to the adopted strategy between UOP, EOP, or ROP.

Specifically, the CN m of the LDPC code is coupled to those VNs with index n belonging to $N_m$, with m ranging from 0 to M-1 and n from 0 to N-1. During the update of CN m, the SOs related to these VNs are first acquired and then processed by the CN processor. Usually, the natural order is followed: for instance, if CN 5 is coupled to VN 3, 10 and 21, then the input sequence of messages is 3, 10 and 21, and the same is valid for the output sequence. This could be a typical case especially for software implementations of the decoder.

Instead of processing (acquiring and updating) the related messages in the 'natural' order, the order of the messages input and output of a SPU is modified in order to make the sequence compliant to the adopted strategy. This operation is referred to as numbering of the input and output messages in the streams.

As a result, two sequences of numbering are found: the numbering of the messages for acquisition, and the numbering of the messages for update. Generally, the two numberings may differ.

The results of the numbering are used by the decoder to properly construct the stream of messages sent to the SPUs and to direct the storage of the updated messages back in the memory.

Finally, in view of the vectorization of the decoder architecture with parallelism P, all the considerations above hold for a vector of SPU working in parallel; therefore, each CN can be replaced by a layer of P CNs, and each VN can be replaced with a block of P soft outputs.

For structured codes, it might be convenient to use vectors with size P=B, with B being the size of the blocks composing the parity-check matrix H. Then the procedure of numbering the streams of input and output SO can be considered as the numbering of the non-null blocks in the parity-check matrix. Both orders in which blocks are acquired (input block numbering) and updated (output block numbering) are then determined as a result of this procedure.

System Verification

As a final step of system optimization, the best-case assumptions made for EOP and ROP are verified. In other words, once the optimal permutation $\hat{p}$ is known, and the numbering of the input/output messages is performed, the system is verified a-posteriori. If, in view of the assumptions made, some conflict is still present, then additional idle cycles are added to those already computed for UOP, EOP or ROP.

This verification phase is dispensed with if worst-case assumptions, instead of best-case assumptions are made. But, in the last case the number of idle cycles is always overestimated, and the use of the best-case assumption plus verification usually leads to fewer or at most the same number of idle cycles.

Finally, verification is not required for the UOP arrangement, which has been derived under no best- or worst-case assumptions

Exemplary VLSI Implementation

The support of the idle mechanism is assured by the architecture implementing the SPU. Especially, the timing of operations is synchronized, because input messages are acquired serially. This may be done through synchronization signals that inform the SPU about the arrival of the first message in input stream of a new layer.

For this purpose, two synchronization signals may be used:

a start signal, marking the begin of the input stream of a layer, and a stop signal, marking the end of the input stream of the layer.

Figure 8:
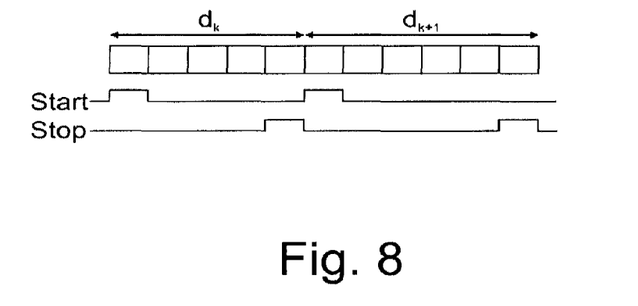
FIG. 8 is a diagram showing the start and stop timing of a Serial Processing Unit (SPU) in case of no insertion of idle clock cycles.

This situation is represented in FIG. 8, where the start signal has been made synchronous with the first message of the stream and the stop signal is asserted high with the reception of the last message of the layer.

Specifically, FIG. 8 shows the synchronization of the start and stop signals on layer k when $I_k$ is zero (i.e. in the absence of idle cycles).

Conversely, an additional time shift of exactly $I_k$ clock cycles is introduced between the stop signal related to the current layer k and the start signal of the next layer k+1, when $I_k$ is not zero. This situation is shown on FIG. 9.

Figure 9:
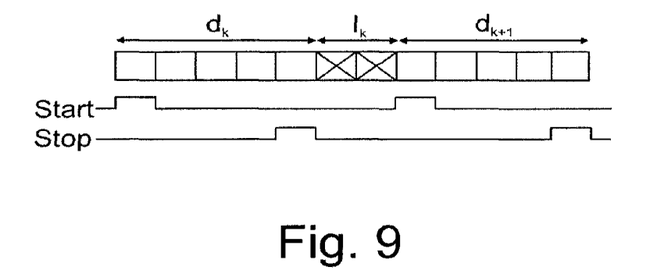
FIG. 9 is a diagram showing the start and stop timing of a Serial Processing Unit (SPU) in case of insertion of idle clock cycles.

Thus, the time shift between the start and stop signals can be used to put the SPU in idle mode, making the processor insensitive to input data.

Generally, processing of the SPU can be divided in three successive phases: acquisition of the input data, internal processing, and release of the output data stream.

Concerning the latencies measured in clock cycles for the processing of the layer k, the serial acquisition of the input streams takes $d_k$ clock cycles, the internal processing requires $L_{SPU}$ clock cycles, and the release of the updated messages takes again $d_k$ clock cycles.

When idle cycles are introduced for the layer k, the acquisition phase of layer k+1 is suspended, while the processing and release of the updated messages of layer k is still in progress.

As already mentioned in the foregoing, in the absence of idle cycles, a generic serial SPU could not support decreasing degrees among two consecutive layers.

Figure 10:
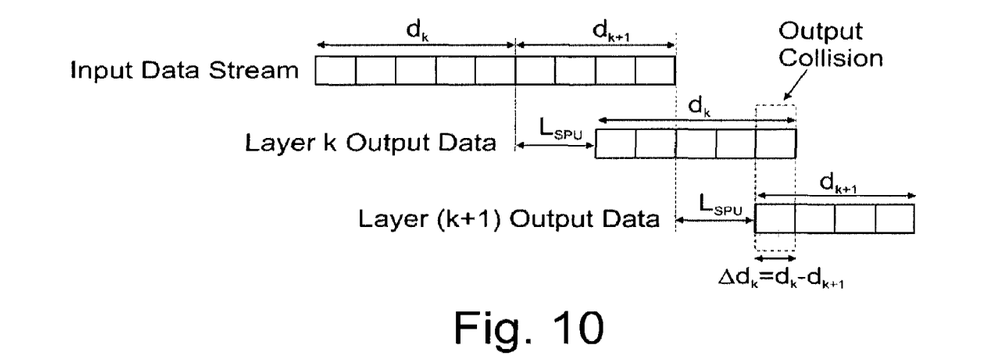
FIG. 10 is a diagram showing output data collision with decreasing idle cycles and in the absence of idle cycles.

The reason is that in case of decreasing degrees (i.e. $d_{k+1} < d_k$) an overlap in time arises between the output of two subsequent layers. The overlap measured in clock cycles is equal to the difference of the degrees $\Delta d_k = d_k - d_{k+1}$. This case is depicted in FIG. 10 where an output overlap of one clock cycle ($\Delta d_k = 1$) between layers k and k+1 is shown.

Figure 11:
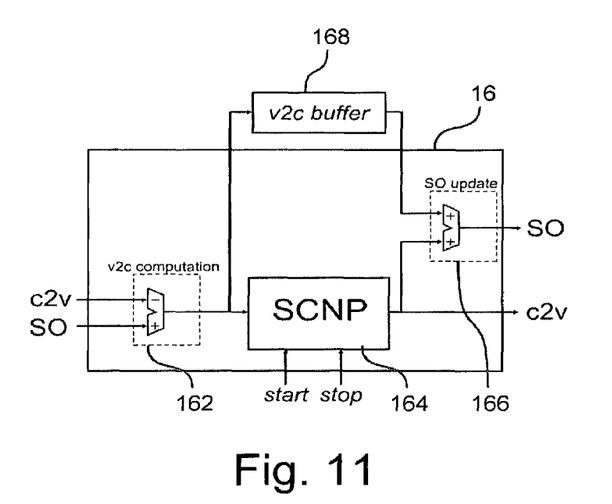
FIG. 11 shows a generic model for a VLSI architecture of a Serial Processing Unit (SPU) in the case of a possible implementation of an idling mechanism in a vectorized HLS decoder.

A generic model of the VLSI architecture of the SPU is shown in FIG. 11.

The start and stop signals are input to the SCNP 164, which is the core of the SPU 16 and implements the CN update on the input v2c messages. Those skilled in the art will appreciate that a large variety of implementations of the idle mechanism could be used without departing from the scope of the disclosure.

The SPU 16 receives two types of signals as an input: the c2v messages and the SOs. Preferably, the v2c messages, which are the real input of the SCNP core 164, are first derived in an input stage such as the adder 162. The SCNP 164 then updates the c2v messages, which are used along with replicas of the v2c messages to obtain the updated SOs through a further output stage, such as the adder 166. The updated c2v messages and SOs are then the outputs of the SPU 16.

The v2c messages used for the SO update are retrieved from the v2c buffer 168, which is a storage element keeping the results of the input v2c computation. These are first used to feed the SCNP 164 and then reused on its output to update the SO message. The v2c buffer 168 is used to equalize the latency of the SCNP 164.

Two approaches may be followed to implement the v2c buffer: a concentrated design based on RAM memory, or a distributed design based on registers. Depending on the strategy adopted to organize the processor input and output streams (UOP, EOP, ROP) and on the size of the buffer (the buffer is dimensioned to cope with the maximum CN degree) one implementation can be preferable over the other.

When the output order is the same of the input sequence (EOP) a distributed design made up by a chain of shift registers is the most straightforward solution. Anyway, a RAM-based implementation is possible too. For example a dual port memory, dimensioned on the maximum CN degree can be used and accessed according to a First-In First-Out (FIFO) strategy. Indeed, it is likely that for low CN degrees the register-based solution is more efficient.

When the output order is reversed with respect to the input sequence (ROP) a distributed solution is still viable if the registers are coupled in such a way to implement a Last-In First-Out (LIFO) buffer, which performs the sequence reversion. Since additional multiplexing is required to manage the reversion of the stream, this solution becomes less efficient for increasing CN degree. Also, the RAM-based approach can be used in this case, and the memory is dimensioned on the maximum CN degree as for EOP.

When the composition of the output stream is independent of the input one (UOP), the register-based solution becomes almost unfeasible and the memory-based approach may be the only viable option. In this case the memory should be dimensioned on the worst-case scenario, i.e. for the maximum CN degree in the code.

Specifically, the many (small) memories possibly required by very large designs (i.e., for P>>1) can be packed in a very efficient way, or vectorized similarly to the SO and c2v memory, and the concentrated approach can result less convenient even when EOP or ROP strategies are adopted. In any case, the memory-based approach calls for configuration information to be stored in the Control Logic Unit (CLU) of the decoder.

The strategy adopted for the buffering of the v2c messages is compatible with the internal architecture of the SCNP, meaning that also the SCNP 164 is able to produce the stream of the updated c2v messages according to the same strategy (UOP, EOP, ROP) used to drive the v2c buffer 166.

Figure 12:
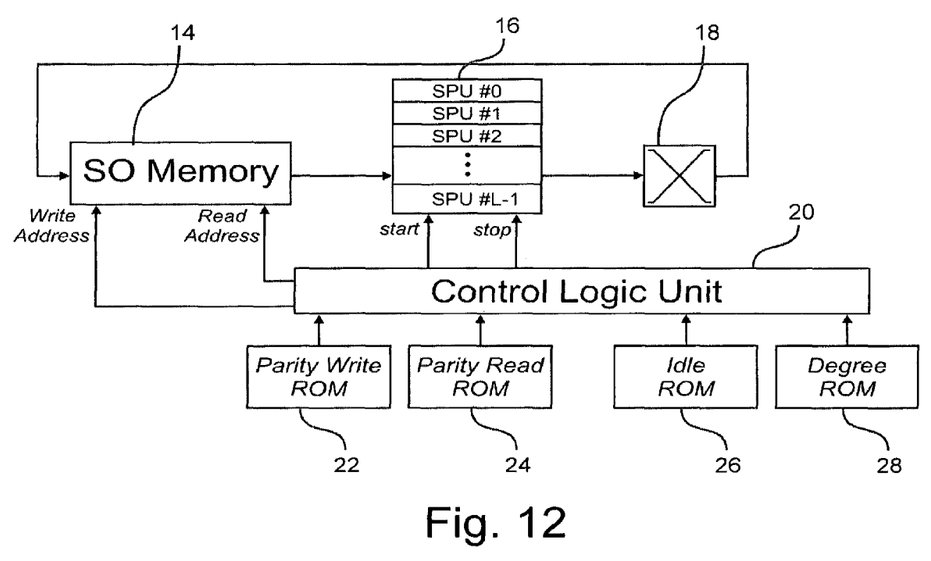
FIG. 12 is block diagram of a Control Logic Unit supporting an idling mechanism.

FIG. 12 shows a possible implementation of the idle mechanism into a vectorized HLS decoder within a SPU architecture as shown in FIG. 11.

The CLU 20 exploits the information stored in the parity write and read memories 22 and 24, respectively, to produce the proper write and read addresses for the SO memory according to the strategy chosen for the I/O streams of the SPU 16. In particular, the read addresses, resulting from the input block numbering phase as described previously, are consecutively stored for each layer of the code into the Parity Read memory 22. Similarly, the write addresses are stored into the Parity Write memory 24 as a result of the output block numbering phase described previously.

Figure 13:
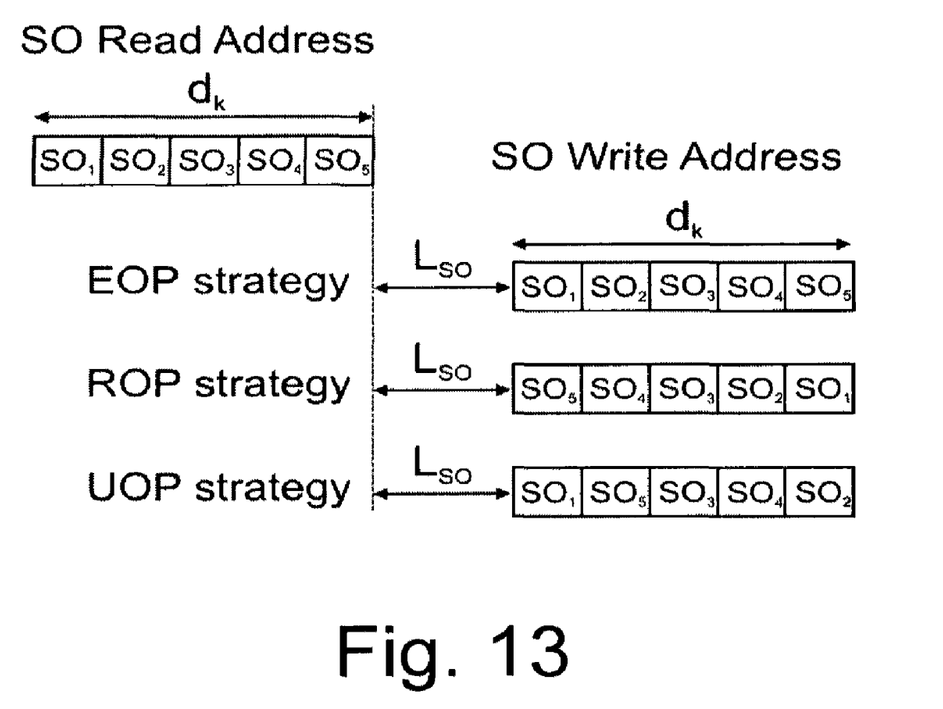
FIG. 13 is a diagram exemplary of Read/Write operation of Soft Output (SO) memory addresses for a layer k.

Two distinct memories may be used when the UOP strategy is adopted, because the waveform of the write address cannot be derived easily from the read address (see FIG. 13). Conversely, in case of the EOP or ROP strategy, the Parity Write memory 22 could be avoided. In these cases, the waveform of the write address can be derived from the read address, i.e. by a buffer with size $L_{SO}$ implementing a FIFO (EOP) or a LIFO strategy (ROP).

An Idle ROM 26 may store the number of idle cycles $I_k$ to be inserted between successive layers, after the end of the acquisition of the current layer and before the beginning of the next one, while a Degree ROM 28 stores the degree $d_k$ of each layer.

Based on the values of these two ROMs, the CLU 20 produces the start and stop signals to properly synchronize the vector of SPUs 16.

In a possible implementation, at the beginning of the layer k the start signal is asserted high and a dedicated degree counter is reset. The counter is incremented with every new message acquired by the SPUs, and when it reaches $d_k$, the stop signal is asserted high, marking the end of the acquisition phase of layer k.

After $I_k$ clock cycles, e.g. counted with another dedicated counter, the start signal is asserted high, the degree counter is incremented again, i.e., goes to one, and the acquisition of the following layer k+1 begins.

Exemplary Embodiment of the IEEE 802.11n Standard

For example, the proposed method can be applied to the LDPC codes designed for the IEEE 802.11n standard. The standard defines three codeword lengths (648, 1296 and 1944 bits), and for each codeword four code rates (½, ⅔, ¾ and ⅚) are considered. To each defined code, an HLS decoder as shown in FIG. 2 can be associated, considering a layer width equal to the parallelism factor of the parity check matrix (L=P).

reported in the row labelled "#Blocks" of Table 1, along with the values of $$\left(\sum_{k=0}^{\Lambda-1} I_k\right)$$

for the different strategies (UOP, EOP, ROP).

TABLE 1

Idle clock cycles per iteration for IEEE 802.11n LDPC codes.

| | IEEE 802.11n LDPC codes | | | | | | | | | | | |
|---|---|---|---|---|---|---|---|---|---|---|---|---|
| Codeword | N = 648 | | | | N = 1296 | | | | N = 1944 | | | |
| Rate | 1/2 | 2/3 | 3/4 | 5/6 | 1/2 | 2/3 | 3/4 | 5/6 | 1/2 | 2/3 | 3/4 | 5/6 |
| #Layers | 12 | 8 | 6 | 4 | 12 | 8 | 6 | 4 | 12 | 8 | 6 | 4 |
| #Blocks | 88 | 88 | 88 | 88 | 86 | 88 | 88 | 85 | 86 | 88 | 85 | 79 |
| | # Idle clock cycles per iteration | | | | | | | | | | | |
| native | 91 | 46 | 47 | 22 | 81 | 46 | 60 | 43 | 77 | 47 | 48 | 41 |
| EOP | 60 | 28 | 30 | 20 | 57 | 36 | 30 | 20 | 53 | 40 | 30 | 20 |
| ROP | 8 | 0 | 6 | 15 | 7 | 0 | 6 | 16 | 8 | 1 | 5 | 20 |
| UOP | 8 | 0 | 2 | 13 | 4 | 0 | 2 | 10 | 6 | 0 | 1 | 4 |
| | % Idle clock cycles saving vs. "native" (%) | | | | | | | | | | | |
| EOP | 34.07 | 39.13 | 36.17 | 9.09 | 29.63 | 21.74 | 50 | 53.49 | 31.17 | 14.89 | 37.5 | 51.22 |
| ROP | 91.21 | 100 | 87.23 | 31.82 | 91.36 | 100 | 90 | 62.79 | 89.61 | 97.87 | 89.58 | 51.22 |
| UOP | 91.21 | 100 | 95.74 | 40.91 | 95.06 | 100 | 96.67 | 76.74 | 92.21 | 100 | 97.92 | 90.24 |

Using the previously explained top-level architecture of the decoder, a typical value of the latency of the data-path of the SOs is 5 clock cycles ($L_{SO}=5$).

Table 1 summarizes possible numbers of idle cycles per iteration for a correct HLS decoding of each defined code. In particular, the row labelled as "native" provides the reference number of idle clock cycles resulting from the original order of the layers and without applying any optimisation strategy for the I/O block numbering. Then, the number of idle clock cycles resulting from the UOP, EOP, and ROP optimization strategies are reported along with the percentage of saving with respect to the original "native" case.

As already mentioned in the foregoing, the adoption of the UOP method gets the best performance, showing a saving in the number of idle cycles ranging from 41% (codeword=648, rate=⅚) to 100% (codeword=648, 1296 and 1944 rate=⅔). Despite being sub-optimal, ROP also gets very good performance, similar to UOP.

In order to better understand the impact of the latency overhead introduced by the idle clock cycles on the whole decoding latency, the total number of idle clock cycles per iteration needs to be compared with the number of blocks in the parity-check matrix of the code (see the row labelled as "#Blocks" in Table 1). Indeed, with reference to the decoder architecture of FIG. 2 and to the pipeline of the SPU processing, the latency in clock cycles of a generic iteration $L_{it}$ is the sum of the non null blocks in the LDPC code plus the overall number of idle cycles. The corresponding formula is:

$$L_{it} = \sum_{k=0}^{\Lambda-1} d_k + \sum_{k=0}^{\Lambda-1} I_k \quad (18)$$

In equation (18) the overall number of blocks in the code is simply given by the sum of the degrees $d_k$ over the layers of the code and its numerical values for the considered codes are Consequently, without prejudice to the underlying principles of the disclosure, the details and the embodiments may vary, even appreciably, with reference to what has been described by way of example only, without departing from the scope of the disclosure.

LIST OF REFERENCES

[1] IEEE 802.11n. Wireless LAN Medium Access Control and Physical Layer specifications: Enhancements for Higher Throughput. IEEE P802.16n/D1.0, March 2006.

[2] IEEE 802.16e. Air Interface for Fixed and Mobile Broadband Wireless Access Systems. IEEE P802.16e/D12 Draft, October 2005.

[3] European Telecommunications Standards Institute (ETSI). Digital Video Broadcasting (DVB) Second generation framing structure for broadband satellite applications; EN 302 307 V1.1.1. www.dvb.org.

[4] M. Mansour and N. R. Shanbhag. High-throughput LDPC decoders. IEEE Trans. VLSI Syst., 11(6):976-996, December 2003.

[5] D. Hocevar. A Reduced Complexity Decoder Architecture via Layered Decoding of LDPC Codes. In IEEE Workshop on Signal Processing Systems, SISP 2004, pages 107-112, 2004.

[6] US 2004/0194007 A1—D. Hocevar, "Layered Low-density Parity-Check Decoding For Digital Communications".

[7] WO 2006/020205 A1—D. Hocevar, "Improvements to a Layered Decoding Approach for Low-Density Parity-Check (LDPC) Codes".

[8] US 2005/0138519 A1—E. Boutillon, J. Tousch, F. Guilloud, "LDPC Decoder, Corresponding Method, System and Computer Program".

[9] EP 1 622 276 A2—D. Hocevar, "Layered Decoding of Low-Density Parity-Check (LDPC) Codes".

What we claim is:

1. A decoder, comprising:
   an input node operable to receive parity-encoded layers of data, each layer including respective messages; and
   a processing circuit coupled to the input node and operable to
     process the messages of a first one of the layers in a first order to generate processed data, and
     process the messages of a second one of the layers in a second order using a portion of the processed data.

2. The decoder of claim 1 wherein:
   the processing circuit is further operable to generate the processed data by generating a respective data segment for each message in the first layer; and
   the portion of the processed data includes an integral number of the data segments.

3. The decoder of claim 1 wherein the first order depends on the second order.

4. The decoder of claim 1 wherein the second order comprises the inverse of the first order.

5. The decoder of claim 1 wherein the second order is equal to the first order.

6. The decoder of claim 1 wherein the second order depends on a third order in which the processing circuit is operable to process a third one of the layers after commencing processing of the second layer.

7. The decoder of claim 1 wherein the processing circuit is further operable to wait a delay period between finishing the processing of the first layer and commencing the processing of the second layer.

8. The decoder of claim 1 wherein the processing circuit is further operable to process the layers in an order that is different from an order in which the input node receives the layers.

9. A receiver, comprising:
   an input node operable to receive a signal that includes parity-encoded layers of data, each layer including respective messages; and
   a decoder coupled to the input node and operable to
     process the messages of a first one of the layers in a first order to generate processed data, and
     process the messages of a second one of the layers in a second order using a portion of the processed data.

10. A system, comprising:
    a receiver including an input node operable to receive a signal that includes parity-encoded layers of data, each layer including respective messages, and
    a decoder coupled to the input node and operable to
      process the messages of a first one of the layers in a first order to generate processed data, and
      process the messages of a second one of the layers in a second order using a portion of the processed data; and
    a controller coupled to the receiver.

11. The system of claim 10 wherein:
    the receiver is disposed on a first integrated-circuit die; and
    the controller is disposed on a second integrated-circuit die.

12. The system of claim 10 wherein the receiver and the controller are disposed on a same integrated-circuit die.

13. A method, comprising:
    receiving parity-encoded layers of data; and
    determining an order for processing the layers, the order yielding a combined inter-layer processing time that is less than a combined inter-layer processing time for another processing order.

14. The method of claim 13 wherein receiving the layers comprises receiving the layers in an order that is different than the determined order.

15. The method of claim 13, further comprising processing the layers in the determined order.

* * * * *